(12) United States Patent
Wataya et al.

(10) Patent No.: US 6,693,674 B1
(45) Date of Patent: Feb. 17, 2004

(54) SOLID-STATE IMAGE-PICKUP DEVICE AND METHOD OF MOUNTING SOLID-STATE IMAGE-PICKUP DEVICE

(75) Inventors: Yukinobu Wataya, Kanagawa (JP); Emiko Sekimoto, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/080,669

(22) Filed: May 19, 1998

(30) Foreign Application Priority Data

May 23, 1997 (JP) .......................................... P09-133944

(51) Int. Cl.⁷ ............................................... H04N 5/225
(52) U.S. Cl. ....................................................... 348/373
(58) Field of Search ................................. 348/373, 374, 348/375, 376, 294, 340, 335; 257/433, 432, 431, 434

(56) References Cited

U.S. PATENT DOCUMENTS

| | | | | |
|---|---|---|---|---|
| 4,594,613 A | * | 6/1986 | Shinbori et al. ............ 348/340 |
| 5,302,778 A | * | 4/1994 | Maurinus ..................... 257/433 |
| 5,359,190 A | * | 10/1994 | O'Regan et al. ............ 257/432 |
| 5,673,083 A | * | 9/1997 | Izumi et al. ................. 348/340 |
| 5,821,532 A | * | 10/1998 | Beaman et al. ............. 250/239 |
| 5,828,409 A | * | 10/1998 | North et al. ................. 348/374 |
| 5,861,654 A | * | 1/1999 | Johnson ...................... 257/433 |

* cited by examiner

*Primary Examiner*—Wendy R. Garber
*Assistant Examiner*—Rashawn N. Tillery
(74) *Attorney, Agent, or Firm*—Rader, Fishman & Grauer PLLC; Ronald P. Kananen, Esq.

(57) ABSTRACT

A pilot opening to the outside is formed at one side end of a package for a solid-state image-pickup device and a guide opening to the outside is formed at a side end opposite to and approximately in parallel with the one side end of the package. The pilot is made to face a pilot pin projecting above a circuit board and a guide pin is inserted into the guide. The solid-state image-pickup device is then fixed at a prescribed position on the circuit board after the pilot comes into contact with the pilot pin. With a solid-state-,image-pickup device and a mounting method thus provided, package size does not become large and mounting is carried out with an extremely high positioning precision.

23 Claims, 3 Drawing Sheets

SOLID-STATE IMAGE-PICKUP DEVICE AND METHOD OF MOUNTING SOLID-STATE IMAGE-PICKUP DEVICE

BACKGROUND OF THE INVENTION

1. Field of the Invention

The present invention relates to a solid-state image-pickup device and method of mounting a solid-state image-pickup device and in particular to a solid-state image-pickup device and method of mounting a solid-state image-pickup device which enable a high precision positioning when mounting the solid-state image-pickup device to a package or when mounting the solid state image-pickup device to an circuit board or lens etc. by a guide provided at a package.

2. Description of Related Art

As shown in FIGS. 1A and 1B, with a related solid-state image-pickup device 21, a solid-state image-pickup element 22 is fixed to a recess of, for example, a Dual In-line Package 23 (DIP), with electrode pads of the solid-state image-pickup element 22 and tips of external leads 24 being connected by internal leads not shown in the drawings within the concave part of the package 23. A transparent flat cap 25 is then bonded to the upper surface of the package 23 and the solid-state image-pickup element 22 is sealed within the package 23. In the case of the dual in-line package, the external leads 4 are lead out to the outside of the package.

This solid-state image-pickup device 21 is provided with a round hole 26 and a long hole 27 within the ends of the periphery of the package 23 as a reference for positioning in being mounted on a circuit board or lens block etc. Positioning pins that are not shown in the drawings are then inserted into the round hole 26 and the long hole 27. These pins are then taken as a reference for positioning the solid-state image-pickup device 21, which is mounted on the circuit board with the external leads 24 being inserted to the mounting holes and with rotation of the solid-state image-pickup device 21 being restricted by the long hole 27.

In a similar way, positioning pins provided on the side of an attaching face of a lens block are inserted into the round hole 26 and the long hole 27 so that the lens block and the solid-state image-pickup device 21 are mutually positioned and the solid-state image-pickup device 21 is thus assembled with the lens block.

However, with this related solid-state image-pickup device, a round hole and a long hole for positioning are provided inside the ends of the periphery of the package, for which it is necessary to broaden the package by at least a portion for providing these holes, so that the package size becomes large.

Further, gaps due to clearances provided between the round hole and the pin to be inserted thereinto and the long hole and the pin to be inserted thereinto necessarily cause errors in positioning including errors in the rotational direction.

In addition, when mounting the dual in-line solid-state image-pickup device on a circuit board, the mounting is carried out by inserting external leads into mounting holes of the circuit board. As a result, the position of the assembled solid-state image-pickup device is dependent on the position of the mounting holes.

The present invention therefore sets out to provide a solid-state image-pickup device and method of mounting a solid-state image-pickup device with which package size does not become large and a high assembly precision is achieved.

SUMMARY OF THE INVENTION

In order to resolve the aforementioned problems, according to the present invention there is provided an electronic device having a chip mounted on a chip-mounting part provided on an upper surface of a package, with electrode pads of the chip being connected to tips of external leads, and a transparent optically flat plate being bonded to the upper surface of the package so that the chip is sealed within the package. The electronic device comprises a pilot and a guide. The pilot opens to the outside at a side end of the package and the guide also opens to the outside at a side end opposite to and approximately in parallel with the side end.

The pilot can be cut-out so as to open to the outside and appear as an approximate V-shape in a plan view and the guide can be cut-out so as to open to the outside and appear as an approximate U-shape in a plan view. The chip can be a solid-state image-pickup element.

Further, according to the present invention, there is provided a method of mounting an electronic device on an electronic component, the electronic device having a pilot and a guide of prescribed shapes respectively provided at side ends approximately opposite to each other, comprising the steps of positioning the electronic device on the electronic component by inserting a guide pin protruding from or via the electronic component to the guide, with a pilot pin protruding from or via the electronic component being brought into contact with the pilot; and mounting the electronic device on the electronic component.

Here, the electronic component can be a circuit board method can further comprise the steps of preparing a pin support jig on which the pilot pin and the guide pin are provided at a prescribed pin spacing; and inserting the pilot pin and the guide pin into guide holes of the circuit board provided at a spacing identical to the pin spacing.

The electronic component can be a lens block.

The pilot can be cut-out so as to open to the outside and appear as an approximate V-shape in a plan view, and the guide can be cut-out so as to open to the outside and appear as a U-shape in a plan view.

The electronic device can be a solid-state image-pickup device.

Moreover, according to the present invention, there is provided a camera comprising a solid-state image-pickup device and a lens block. The solid-state image-pickup device comprising a package, a solid-state image-pickup element, a transparent optically flat plate, a pilot and a guide.

The solid-state image-pickup element is mounted on an image-pickup element mounting part provided on an upper surface of the package, with electrode pads of the image-pickup element being connected to tips of external leads. The transparent optically flat plate is bonded to the upper surface of the package so that the image-pickup element is sealed within the package. The pilot is of a shape gradually opening to the outside at a side end of the package, and the guide opens to the outside at a side end opposite to the side end. Here, the lens block has a plurality of pins coming into contact with the pilot and the guide, respectively.

DETAILED DESCRIPTION OF THE PREFERRED EMBODIMENTS

First Embodiment

A description will now be given of a preferred embodiment of the present invention with reference to the drawings.

With the solid-state image-pickup device of this embodiment of the present invention, an example is given of a Leadless Chip Carrier (LCC) package where external leads do not protrude out of the package.

Figure 1A:
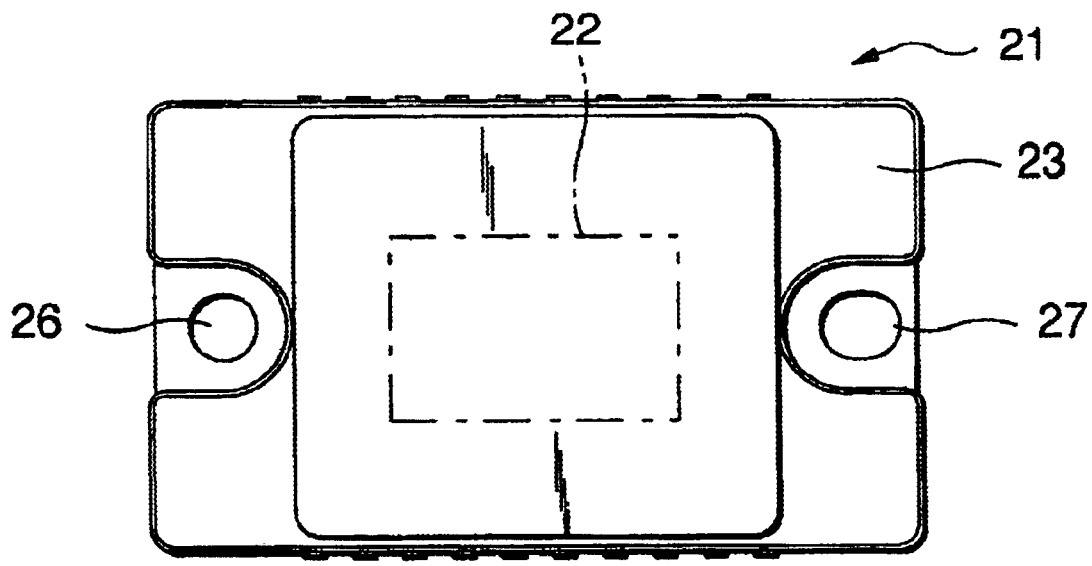
FIGS. 1A and 1B are a front view and a side view of a related solid-state image-pickup device, respectively.
Figure 1B:
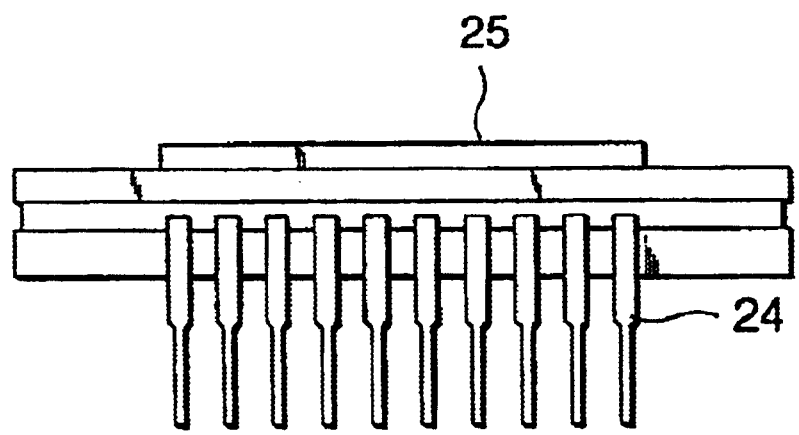
Figure 2A:
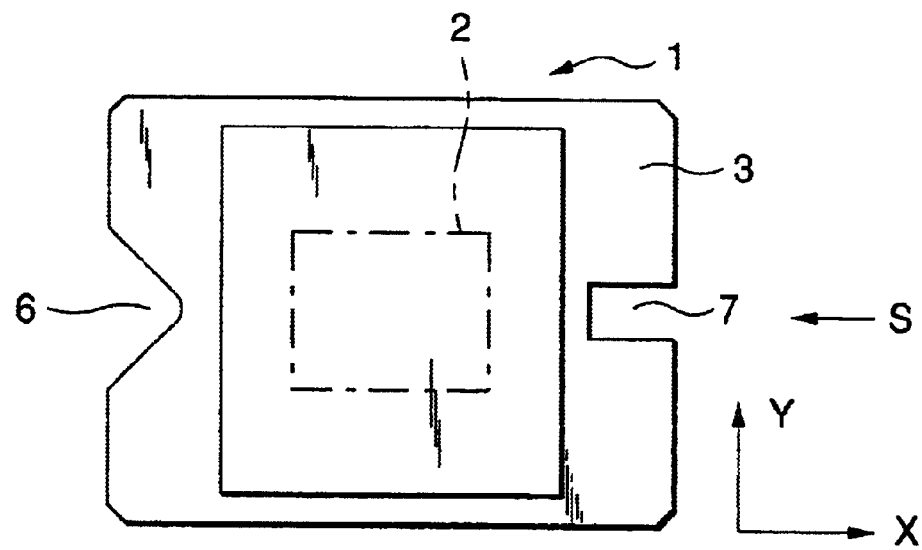
FIGS. 2A to 2C are a plan view, a side view and a view taken in the direction of an arrow S of the solid-state image-pickup device of the present invention, respectively.
Figure 2B:
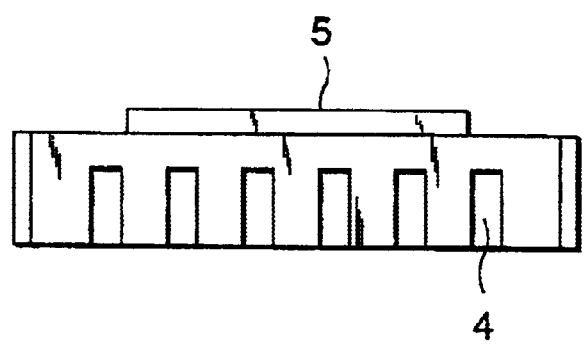
Figure 2C:
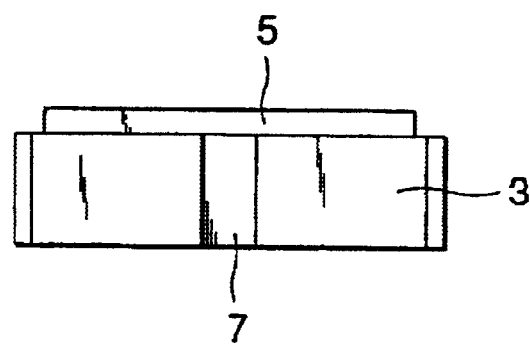
Figure 3:
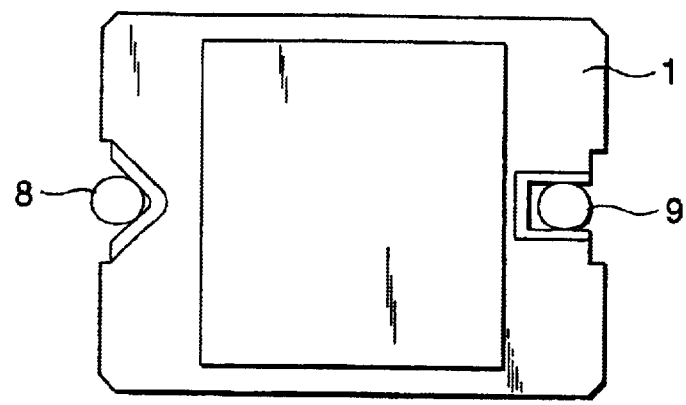
FIG. 3 is a plan view illustrating a method of positioning a package of the solid-state image-pickup device of the present invention.

FIGS. 2A to 2C show a solid-state image-pickup device of the present invention, where FIG. 2A is a plan view, FIG. 2B is a side view and FIG. 2C is a view taken in the direction of an arrow S. FIG. 3 is a plan view illustrating a method of positioning the solid-state image-pickup device package.

In FIGS. 2A to 2C, numeral 1 represents a solid-state image-pickup device configured, with the exception of the external leads, in the same manner as the solid-state image-pickup device described in the related art, with a solid-state image-pickup element 2 being fixed to a recess on a package 3 and electrode pads of the solid-state image-pickup element 2 being connected to tips of external leads 4 by internal leads not shown in the drawings within the recess of the package 3. A transparent optically flat cap 5 is then bonded to the upper surface of the package 3 to seal the solid-state image-pickup element 2 within the package 3.

The solid-state image-pickup device 1 is provided with a pilot 6 and guide 7 that are opened from outside at the ends of the package 3 as reference for positioning when mounting the solid-state image-pickup element 2 on the package 3 or when combining the solid-state image-pickup device 1 with a circuit board or lens block etc. As examples of the pilot and guide, there are a pilot 6 provided as a notch that appears V-shaped when viewed from above and a guide 7 that appears U-shaped when viewed from above.

With the pilot 6 of this solid-state image-pickup device 1 being made to face a pilot pin 8 and a guide pin 9 being fitted into the guide 7 of the solid-state image-pickup device 1, the pilot 6 is brought into contact with the pilot pin 8 as shown by the arrow in FIG. 3 to uniquely determine positions of the solid-state image-pickup device 1 both in X and Y directions with the guide 7 determining the position in the rotational direction by the guide pin 9.

The solid-state image-pickup element 2 can be mounted on the package 3 thus guided by this pilot 6 and guide 7 with the solid-state image-pickup element 2 being positioned.

First, the solid-state image-pickup element 2 is mounted on the package 3 which is positioned as shown in FIG. 2, where the package 3 is shifted in the direction shown by the arrow on a device for mounting the solid-state image-pickup element 2 not shown in the drawings so that a pilot pin 8 is brought into contact with the pilot 6, with the guide 7 being guided by the guide pin 9. A solid-state image-pickup device 1 can therefore be obtained where the solid-state image-pickup element 2 is mounted at a prescribed position of the package 3 with high precision.

Figure 4:
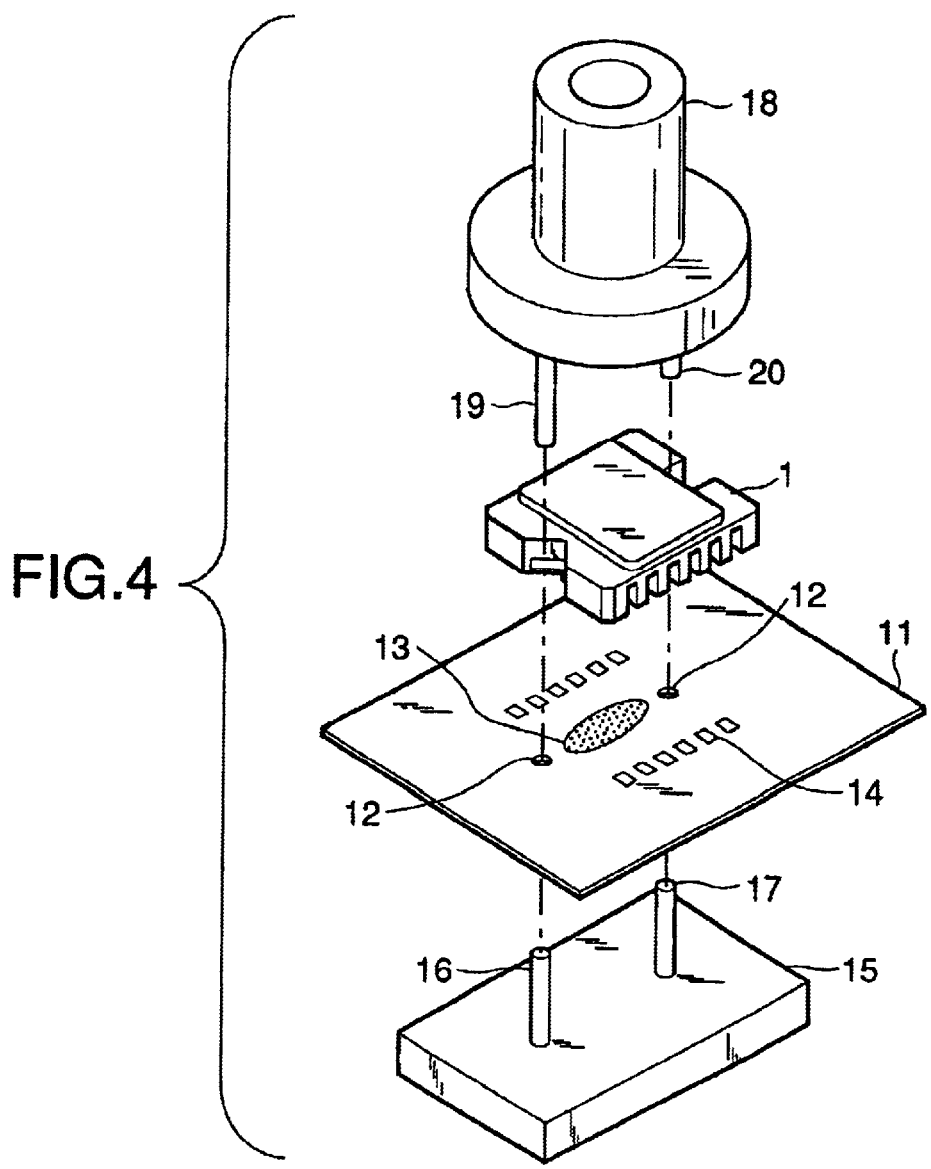
FIG. 4 is a perspective view illustrating conditions for assembling the solid-state image-pickup device of the present invention.

FIG. 4 is a perspective view illustrating a method of assembling the solid-state image-pickup device 1 of the present invention with the circuit board and a lens block.

In FIG. 4, numeral 11 indicates the circuit board, numeral 12 indicates insertion holes for positioning provided at the circuit board 11, numeral 13 indicates adhesive for bonding the circuit board 11 to the solid-state image-pickup device 1 and numeral 14 indicates a land pattern connected with the external leads 4. A pin support jig 15 for positioning the solid-state image-pickup device 1 on the circuit board 11 is provided at the lower side of the circuit board 11. A pilot pin 16 coming into contact with the pilot 6 of the solid-state image-pickup device 1 for positioning the package 3 of the solid-state image-pickup device 1 in X and Y directions on the circuit board 11 and a guide pin 17 for guiding and restricting rotation of the guide 7 are provided at the pin support jig 15.

The insertion holes 12 provided at the circuit board 11 are formed with the same distance as that between the pilot pin 16 and the guide pin 17.

A lens block 18 is provided on the side of the image-pickup plane of the solid-state image-pickup device 1. Pins 19 and 20 are provided in a protruding manner on the attaching face of this lens block 18 at the same distance as that between the pilot pin 16 and the guide pin 17. The optical axis of the solid-state image-pickup device 1 and the optical axis of the lens block 18 are then made to coincide by bringing the pin 19 into contact with the pilot 6 and by making the pin 20 to be guided by the guide 7.

A method of positioning and mounting the solid-state image-pickup device 1 on the circuit board 11 will now be described with reference to FIG. 3 and FIG. 4.

As shown in FIG. 4, the pilot pin 16 and the guide pin 17 of the pin support jig 15 project from the insertion holes 12 of the circuit board 11. The pilot pin 16 and the guide pin 17 prepare the solid-state image-pickup device 1 for being positioned on the circuit board 11. At this time, a prescribed amount of adhesive 13 is applied to the prescribed place on the circuit board 11 beforehand.

With the pilot 6 of the solid-state image-pickup device 1 being made to face the pilot pin 16 projecting above the circuit board 11 and the guide pin 17 being fitted into the guide part 7 of the solid-state image-pickup device 1, the pilot 6 is brought into contact with the pilot pin 16 as shown by the arrow of FIG. 2, whereby the positions of the solid-state image-pickup device 1 are uniquely determined in X and Y directions with respect to the circuit board 11 with rotation of the guide 7 being restricted by the guide pin 17, and thus the positioning is finished. The solid-state image-pickup device 1 in this state is then pushed onto the circuit board 11 so as to be bonded to the circuit board 11 by the adhesive 13. At this time, the external leads 4 of the solid-state image-pickup device 1 do not protrude from the package 3 (because the example given is of a leadless chip carrier (LCC) type) and the solid-state image-pickup device 1 can be easily positioned on the circuit board 11. The external leads 4 and the land pattern 14 are then connected by soldering.

A method for mounting a lens block 18 on the solid-state image-pickup device 1 will be described with reference to FIG. 4. Here, the solid-state image-pickup device has been positioned on the circuit board 11 and has been bonded and wired thereto.

The pin support jig 15 is pulled out from the circuit board 11 to which the solid-state image-pickup device 1 fixed. The pins 19 and 20 of the lens block 18 are inserted into the pilot 6 and guide 7 of the semiconductor image-pickup device from which the pin support jig 15 has been pulled out and the insertion holes 12, 12 of the circuit board 11 so that the lens block 18 is arranged on the side of the image-pickup plane of the solid-state image-pickup device 1. The lens block 18 is then shifted so that the pin 19 comes into contact with the pilot 6 of the solid-state image-pickup device 1. The positions of the lens block 18 in X and Y directions with respect to the solid-state image-pickup device 1 are then uniquely determined with rotation being restricted by the pin 20 within the guide 7, so that the positioning is finished. The lens block 18 having been positioned with respect to the solid-state image-pickup device 1 is then fixed to the solid-state image-pickup device 1 or the circuit board 11 using screws or adhesive etc. not shown in the drawings.

In this way, the solid-state image-pickup device 1 installed on the circuit board 11 and the lens block 18 are mounted at a prescribed position with the optical axes thereof coinciding with each other.

There is a certain clearance between the guide 7 and the guide pin 16 or the pin 20 and a positional error may be caused in the direction of rotation. However, there is also such clearance between the round hole and pin or between the long hole and pin in the related solid-state image-pickup device. Nevertheless, when the clearance between the round hole and pin or between the long hole and pin of the related solid-state image-pickup device is the same as the clearance between the guide 7 and guide pin 16 or pin 20 of the present invention, the contact between the pilot 6 and the pilot pin 16 or pin 19 in the solid-state image-pickup device 1 of the present invention causes little clearance. The error in the direction of rotation in the present invention is therefore reduced by approximately half compared with the related solid-state image-pickup device.

As described above, the solid-state image-pickup device of the present invention is provided with guides that open to the outside at the side ends of a package and can therefore be made smaller than packages for solid-state image-pickup devices provided with holes as references for positioning.

Further, a pilot is taken to be a notch opening to the outside and a guide is taken to be a notch opening to the outside, and a pilot pin is brought into contact with the pilot with rotation being restricted by a guide pin fitted into the guide. This can increase precision in positioning at the time of mounting of a solid-state image-pickup element, mounting of a solid-state image-pickup device on a circuit board or mounting of a lens block.

What is claimed is:

1. An electronic device having a chip mounted on a chip-mounting part provided on an upper surface of a package, with electrode pads of said chip being connected to tips of external leads, and a transparent optically flat plate being bonded to said upper surface of said package so that said chip is sealed within said package, said electronic device comprising:
   a pilot opening to the outside at a side end of said package; and
   a guide opening to the outside, at a side end opposite to and approximately in parallel with said side end,
   wherein said pilot opening is cut-out so as to open to the outside and appear as an approximate V-shape in a plan view and said guide opening is cutout so as to open to the outside and appear as an approximate U-shape in a plan view.

2. The electronic device of claim 1, wherein said chip is a solid-state image-pickup element.

3. A method of mounting an electronic device on an electronic component, said electronic device having a pilot and a guide of prescribed shapes respectively provided at side ends approximately opposite to each other, comprising the steps of:
   positioning said electronic device on said electronic component by inserting a guide pin protruding from or via said electronic component to said guide with a pilot pin protruding from or via said electronic component being brought into contact with said pilot; and
   mounting said electronic device on said electronic component,
   wherein said pilot is cut-out so as to open to the outside and appear as an approximate V-shape in a plan view, and said guide is cut-out so as to open to the outside and appear as an approximate U-shape in a plan view.

4. The method of mounting an electronic device of claim 3, wherein said electronic component is a circuit board.

5. The method of mounting an electronic device of claim 4, further comprising the steps of:
   preparing a pin support jig on which said pilot pin and said guide pin are provided at a prescribed pin spacing; and
   inserting said pilot pin and said guide pin into guide holes of said circuit board provided at a spacing identical to said pin spacing.

6. The method of mounting an electronic device of claim 3, wherein said electronic component is a lens block.

7. The method of mounting an electronic device of claim 3, wherein said electronic device is a solid-state image-pickup device.

8. An electronic device comprising:
   a package having a top surface, a bottom surface opposite said top surface, a pilot surface adjacent said top and bottom surfaces, a guide surface opposite said pilot surface and adjacent said top and bottom surfaces, a pilot opening, and a guide opening;
   said pilot opening being a groove within said pilot surface that extends from said top surface to said bottom surface, a pilot pin being inserted through said pilot opening;
   said guide opening being a groove within said guide surface that extends from said top surface to said bottom surface, a guide pin being inserted through said guide opening,
   said pilot opening having a shape different than a shape of said guide opening.

9. The electronic device of claim 8, wherein said electronic device further comprises:
   a solid-state device mounted to said package.

10. The electronic device of claim 9, wherein said solid-state device is a solid-state image-pickup element,
    a transparent plate being attached to said top surface to encase said solid-state device within said package,
    electrode pads of said solid-state device being connected to tips of external leads.

11. The electronic device of claim 8, wherein said pilot opening is located at a first distal end of said package, and said guide opening is located at a second distal end of said package, said second distal end being opposite to said first distal end.

12. The electronic device of claim 8, wherein said pilot opening has an approximate V-shape in a plan view, and said guide opening has an approximate U-shape in said plan view.

13. A method of mounting an electronic device on an electronic component comprising the steps of:
    inserting a pilot pin through a pilot opening of said electronic device;
    inserting a guide pin through a guide opening of said electronic device;
    said electronic device including a package having a top surface, a bottom surface opposite said top surface, a pilot surface adjacent said top and bottom surfaces, a guide surface opposite said pilot surface and adjacent said top and bottom surfaces, said pilot opening, and said guide opening, said pilot opening being a groove within said pilot surface that extends from said top surface to said bottom surface, said guide opening being a groove within said guide surface that extends from said top surface to said bottom surface said pilot opening having a shape different than a shape of said guide opening.

14. The method of mounting an electronic device of claim 13, further comprising the steps of:

inserting said pilot pin through a first insertion hole of said electronic component;

inserting said guide pin through a second insertion hole of said electronic component;

mating said electronic device with said electronic component.

15. The method of mounting an electronic device of claim 14, wherein said pilot pin and said guide pin are disposed on a pin support jig at a prescribed pin spacing.

16. The method of mounting an electronic device of claim 14, wherein said electronic component is a circuit board.

17. The method of mounting an electronic device of claim 14, further comprising the steps of:

removing said pilot pin from said first insertion hole;

removing said guide pin from said second insertion hole.

18. The method of mounting an electronic device of claim 13, wherein said pilot opening has an approximate V-shape in a plan view, and said guide opening has an approximate U-shape in said plan view.

19. A camera comprising:

a solid-state image-pickup device, said solid-state image-pickup device including a package, a solid-state image-pickup element, and a lens block;

said solid-state image-pickup element mounted on an image-pickup element mounting part provided on a top surface of said package, electrode pads of said solid-state image-pickup element being connected to tips of external leads;

a transparent optically flat plate being bonded to said top surface of said package to encase said image-pickup element within said package;

said package having said top surface, a bottom surface opposite said top surface, a pilot surface adjacent said top and bottom surfaces, a guide surface opposite said pilot surface and adjacent said top and bottom surfaces, said pilot opening, and said guide opening, said pilot opening being a groove within said pilot surface that extends from said top surface to said bottom surface, a pilot pin being inserted through said pilot opening, said guide opening being a groove within said guide surface that extends from said top surface to said bottom surface, a guide pin being inserted through said pilot opening;

said pilot pin and said guide pin extending from said lens block, said pilot opening having a shape different than a shape of said guide opening.

20. The camera of claim 19, wherein said pilot opening has an approximate V-shape in a plan view, and said guide opening has an approximate U-shape in said plan view.

21. An electronic device comprising:

a package having a top surface, a bottom surface opposite said top surface, a pilot surface adjacent said top and bottom surfaces, a guide surface opposite said pilot surface and adjacent said top and bottom surfaces, a pilot opening, and a guide opening;

said pilot opening being a groove within said pilot surface that extends from said top surface to said bottom surface, a pilot pin being inserted through said pilot opening;

said guide opening being a groove within said guide surface that extends from said top surface to said bottom surface, a guide pin being inserted through said guide opening, said pilot opening being unbounded by said pilot surface and said guide opening being unbounded by said guide surface.

22. A method of mounting an electronic device on an electronic component comprising the steps of:

inserting a pilot pin through a pilot opening of said electronic device;

inserting a guide pin through a guide opening of said electronic device;

said electronic device including a package having a top surface, a bottom surface opposite said top surface, a pilot surface adjacent said top and bottom surfaces, a guide surface opposite said pilot surface and adjacent said top and bottom surfaces, said pilot opening, and said guide opening, said pilot opening being a groove within said pilot surface that extends from said top surface to said bottom surface, said guide opening being a groove within said guide surface that extends from said top surface to said bottom surface, said pilot opening being unbounded by said pilot surface and said guide opening being unbounded by said guide surface.

23. A camera comprising:

a solid-state image-pickup device, said solid-state image-pickup device including a package, a solid-state image-pickup element, and a lens block;

said solid-state image-pickup element mounted on an image-pickup element mounting part provided on a top surface of said package, electrode pads of said solid-state image-pickup element being connected to tips of external leads;

a transparent optically flat plate being bonded to said top surface of said package to encase said image-pickup element within said package;

said package having said top surface, a bottom surface opposite said top surface, a pilot surface adjacent said top and bottom surfaces, a guide surface opposite said pilot surface and adjacent said top and bottom surfaces, said pilot opening, and said guide opening, said pilot opening being a groove within said pilot surface that extends from said top surface to said bottom surface, a pilot pin being inserted through said pilot opening, said guide opening being a groove within said guide surface that extends from said top surface to said bottom surface, a guide pin being inserted through said pilot opening;

said pilot pin and said guide pin extending from said lens block, said pilot opening being unbounded by said pilot surface and said guide opening being unbounded by said guide surface.

* * * * *